United States Patent
Achtenberg et al.

(10) Patent No.: US 10,250,281 B2
(45) Date of Patent: Apr. 2, 2019

(54) ECC DECODER HAVING ADJUSTABLE PARAMETERS

(71) Applicant: SANDISK TECHNOLOGIES LLC, Plano, TX (US)

(72) Inventors: Stella Achtenberg, Netanya (IL); Omer Fainzilber, Even Yehuda (IL); Ariel Navon, Revava (IL); Alexander Bazarsky, Holon (IL); Eran Sharon, Rishon Lezion (IL)

(73) Assignee: SanDisk Technologies LLC, Addison, TX (US)

( * ) Notice: Subject to any disclaimer, the term of this patent is extended or adjusted under 35 U.S.C. 154(b) by 3 days.

(21) Appl. No.: 15/395,185

(22) Filed: Dec. 30, 2016

(65) Prior Publication Data

US 2018/0191381 A1    Jul. 5, 2018

(51) Int. Cl.
| | |
|---|---|
| *G06F 11/10* | (2006.01) |
| *H03M 13/37* | (2006.01) |
| *H03M 13/11* | (2006.01) |
| *G11C 29/52* | (2006.01) |

(52) U.S. Cl.
CPC ..... *H03M 13/3707* (2013.01); *G06F 11/1068* (2013.01); *H03M 13/1105* (2013.01); *G11C 29/52* (2013.01)

(58) Field of Classification Search
CPC .................................................. G06F 11/1076
USPC ........................................ 714/764, 766, 763
See application file for complete search history.

(56) References Cited

U.S. PATENT DOCUMENTS

| | | | |
|---|---|---|---|
| 7,168,054 B2 * | 1/2007 | Van Den Berghe | .... G06F 11/27 714/E11.169 |
| 8,762,798 B2 | 6/2014 | Hu et al. | |
| 8,774,324 B2 | 7/2014 | Dick | |
| 9,059,742 B1 | 6/2015 | Anderson et al. | |
| 2015/0149873 A1 * | 5/2015 | Cai | ..................... H03M 13/458 714/773 |
| 2016/0057654 A1 * | 2/2016 | Backholm | ......... H04W 52/0277 370/236 |
| 2018/0069764 A1 * | 3/2018 | Backholm | ............. H04L 41/145 |

* cited by examiner

*Primary Examiner* — Fritz Alphonse
(74) *Attorney, Agent, or Firm* — Michael Best & Friedrich LLP

(57) ABSTRACT

A device includes a non-volatile memory, a traffic analyzer, and a parameter adjuster. The traffic analyzer is configured to generate a traffic type indicator based on one or more read requests from an access device to access data at the non-volatile memory. The traffic type indicator has a first value responsive to the one or more read requests corresponding to a first traffic type and has a second value responsive to the one or more read requests corresponding to a second traffic type. The parameter adjuster is configured to designate one or more decode parameter values based on the traffic type indicator.

20 Claims, 7 Drawing Sheets

US 10,250,281 B2

ECC DECODER HAVING ADJUSTABLE PARAMETERS

FIELD OF THE DISCLOSURE

The present disclosure is related to error correction code (ECC) decoding.

BACKGROUND

Non-volatile data storage devices, such as embedded flash memory, have allowed for increased portability of data and software applications. Information that is read from a non-volatile data storage device is often processed by an error correction code (ECC) decoder to correct errors that may be introduced into stored data during operation of the non-volatile data storage device. One example of such an ECC decoder is a low-density parity check (LDPC) decoder.

An LDPC decoder may be designed or programmed to have particular parameter values that are based on a performance criterion of the LDPC decoder for a particular system behavior. As one example, the parameter values of the LDPC decoder may be set to meet a particular performance criterion, such as a throughput metric, associated with a particular type of host access mode. Parameter values that enable the LDPC decoder to meet a particular performance criterion may prevent the LDPC decoder from meeting a different performance criterion associated with a different type of host access mode. Failing to meet other performance criterions may reduce the usefulness of the LDPC decoder in some situations.

DETAILED DESCRIPTION

Figure 1:
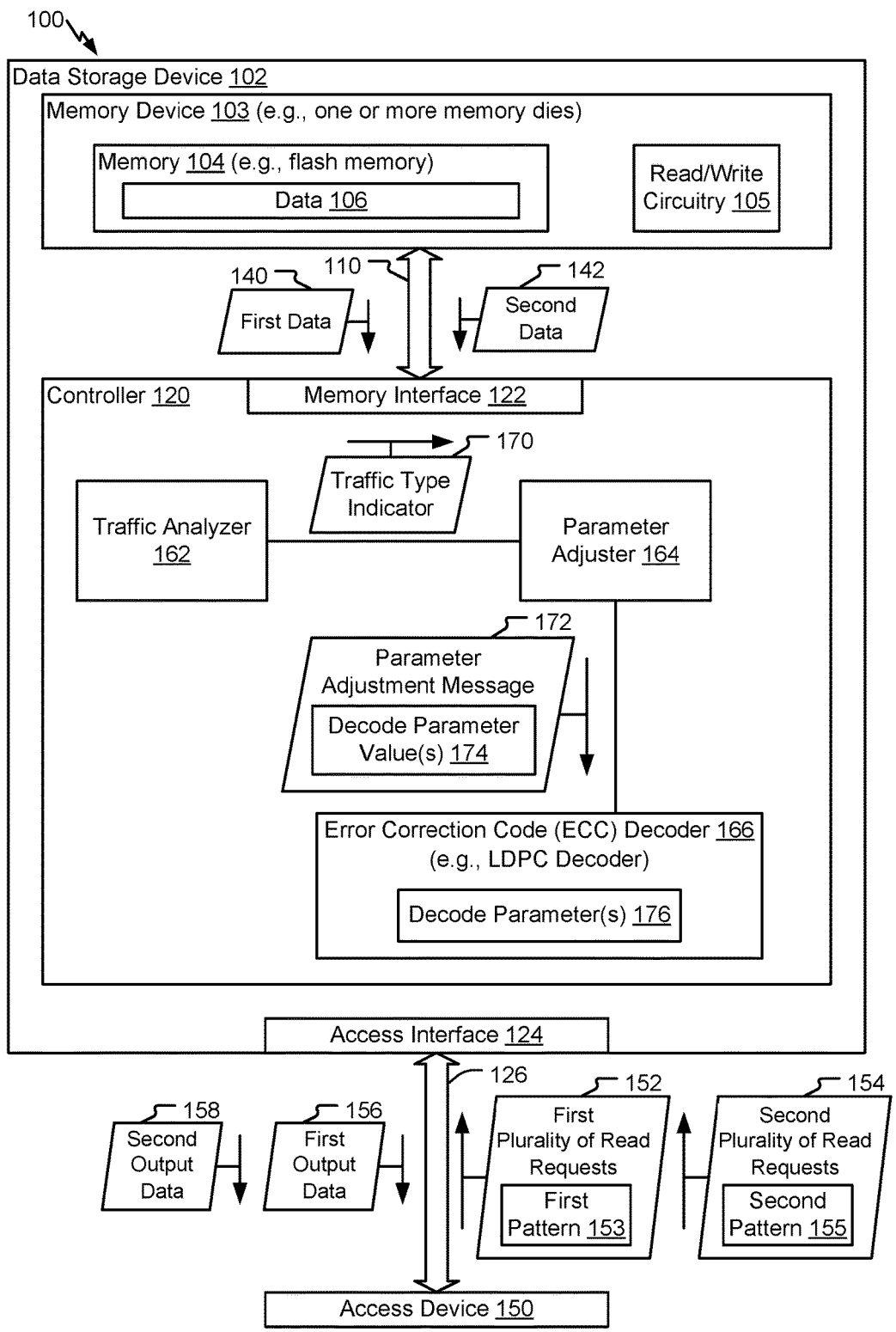
FIG. 1 is a block diagram of an illustrative example of a system including a device configured to designate decode parameter values based on a traffic type of read requests received from an access device.

Particular implementations are described with reference to the drawings. In the description, common features are designated by common reference numbers throughout the drawings. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term).

The present disclosure describes systems, devices, and methods of designating decode parameter values based on a traffic type or pattern of read requests received from an access device. The decode parameter values may be used by an error correction code (ECC) decoder, such as a low-density parity check (LDPC) decoder, to decode representations of data retrieved from a non-volatile memory in response to the read requests. The decode parameter values include decoder mode values, timeout values, log likelihood ratio (LLR) values, or a combination thereof, as non-limiting examples.

To illustrate, a data storage device may receive one or more read requests from an access device. The data storage device may determine a pattern of the read requests to identify a traffic type of the read requests. The pattern may be related to logical block addresses (LBAs) in the read requests, to command sizes of the read requests, or to another characteristic of the read requests. Additionally or alternatively, a traffic type of a single read request or a single command may be identified. For example, a read request may be classified as a particular traffic type based on a LBA in the read request, a payload of the read request, another characteristic, or a combination thereof.

Each traffic type may correspond to an access mode of the access device, and each access mode may have a highest priority performance characteristic (e.g., a "leading performance criterion"). The leading performance criterion may be referred to as a "leading performance requirement." To illustrate, the leading performance criterion may indicate a particular performance characteristic that is to satisfy a threshold or that is to be prioritized above other performance characteristics. For example, throughput may be a leading performance criterion of a sequential access mode, while quality of service (QoS) may be a leading performance criterion of a non-sequential or "random" access mode. The data storage device may designate (e.g., set) one or more decode parameter values of the ECC decoder to improve or to "optimize" the leading performance criterion during a decoding process at the ECC decoder.

Thus, a dynamically configurable ECC decoder is described. The ECC decoder may be operate based on one or more decode parameter values to improve or optimize a particular performance characteristic. By designating the one or more parameter values based on a traffic type of incoming read requests, the one or more parameter values are selected to improve a priority performance characteristic (e.g., a leading performance criterion) of an access mode of the access device that issues the read requests. In this manner, the dynamically configurable ECC decoder is able to meet multiple different leading performance criterions at different times, which improves the utility of the ECC decoder.

FIG. 1 illustrates a system 100 that includes an access device 150 and a data storage device 102. The access device 150 is coupled to the data storage device 102 via a communication path 126. The communication path 126 may be a bus or a wireless connection, as non-limiting examples. The data storage device 102 may include an access interface 124 that enables communication via the communication path 126, such as when the access interface 124 is communicatively coupled to the access device 150 (e.g., the access interface 124 is configured to couple the data storage device 102 to the access device 150). The access interface 124 may be configured to receive one or more read requests from the access device 150, as further described herein.

The access device 150 may include a memory interface (not shown) and may be configured to communicate with the data storage device 102 via the memory interface to read data from and write data to a memory device 103 of the data storage device 102. For example, the access device 150 may operate in compliance with a Joint Electron Devices Engineering Council (JEDEC) industry specification, such as a Universal Flash Storage (UFS) Access Controller Interface specification. As other examples, the access device 150 may operate in compliance with one or more other specifications, such as a Secure Digital (SD) Access Controller specification, as an illustrative, non-limiting example. The access device 150 may communicate with the memory device 103 in accordance with any other suitable communication protocol. The access device 150 may include a mobile telephone, a music player, a video player, a gaming console, an electronic book reader, a personal digital assistant (PDA), a computer, such as a laptop computer or notebook computer, a network computer, a server, any other electronic device, or any combination thereof, as illustrative, non-limiting examples.

The access device 150 may include a processor and a memory. The memory may be configured to store data and/or instructions that are executable by the processor. The memory may be a single memory or may include multiple memories, such as one or more non-volatile memories, one or more volatile memories, or a combination thereof. The access device 150 may issue one or more commands to the memory device 103 of the data storage device 102, such as one or more requests to erase data, read data from, or write data to the memory device 103 of the data storage device 102. For example, the access device 150 may be configured to provide data to be stored at the memory device 103 or to request data to be read from the memory device 103. To illustrate, the access device 150 may be configured to send a first plurality of read requests 152 and a second plurality of read requests 154 to the data storage device 102. The access device 150 may be configured to receive first output data 156 from the data storage device 102 responsive to the first plurality of read requests 152 and to receive second output data 158 from the data storage device 102 responsive to the second plurality of read requests 154.

The memory device 103 of the data storage device 102 may include one or more memory dies (e.g., one memory die, two memory dies, eight memory dies, or another number of memory dies). The memory device 103 includes a memory 104, such as a non-volatile memory of storage elements included in a memory die of the memory device 103. For example, the memory 104 may include a flash memory (e.g., a NAND flash memory, a NOR flash memory, etc.) or a resistive random access memory (ReRAM), as illustrative, non-limiting examples. In some implementations, the memory 104 may include or correspond to a memory die of the memory device 103. The memory 104 may have a three-dimensional (3D) memory configuration. As an example, the memory 104 may have a 3D vertical bit line (VBL) configuration. In a particular implementation, the memory 104 is a non-volatile memory having a 3D memory configuration that is monolithically formed in one or more physical levels of arrays of memory cells having an active area disposed above a silicon substrate. Alternatively, the memory 104 may have another configuration, such as a two-dimensional (2D) memory configuration or a non-monolithic 3D memory configuration (e.g., a stacked die 3D memory configuration).

Although the data storage device 102 is illustrated as including the memory device 103, in other implementations the data storage device 102 may include multiple memory devices that may be configured in a similar manner as described with respect to the memory device 103. For example, the data storage device 102 may include multiple memory devices, each memory device including one or more packages of memory dies, each package of memory dies including one or more memories such as the memory 104.

The memory 104 may include one or more blocks, such as a NAND flash erase group of storage elements. Each storage element of the memory 104 may be programmable to a state (e.g., a threshold voltage in a flash configuration or a resistive state in a resistive memory configuration) that indicates one or more values. For example, the memory 104 may be configured to store data 106. Each block of the memory 104 may include one or more word lines. Each word line may include one or more pages, such as one or more physical pages. In some implementations, each page may be configured to store a codeword. A word line may be configurable to operate as a single-level-cell (SLC) word line, as a multi-level-cell (MLC) word line, or as a tri-level-cell (TLC) word line, as illustrative, non-limiting examples.

The memory device 103 may include support circuitry, such as read/write circuitry 105, to support operation of one or more memory dies of the memory device 103. For example, the read/write circuitry 105 may include one or more buffers, drivers, or other circuitry used to perform read operations, write operations, or both, at the memory device 103. Although depicted as a single component, the read/write circuitry 105 may be divided into separate components of the memory device 103, such as read circuitry and write circuitry. The read/write circuitry 105 may be external to the one or more dies of the memory device 103. Alternatively, one or more individual memory dies of the memory device 103 may include corresponding read/write circuitry that is operable to read data from and/or write data to storage elements within the individual memory die independent of any other read and/or write operations at any of the other memory dies.

The data storage device 102 also includes a controller 120 that is coupled to the memory device 103 via a bus 110, an interface (e.g., interface circuitry, such as a memory interface 122), another structure, or a combination thereof. For example, the bus 110 may include one or more channels to enable the controller 120 to communicate with a single memory die of the memory device 103. As another example, the bus 110 may include multiple distinct channels to enable the controller 120 to communicate with each memory die of the memory device 103 in parallel with, and independently of, communication with other memory dies of the memory device 103.

The controller 120 is configured to receive data and instructions from the access device 150 and to send data to the access device 150. For example, the controller 120 may send data to the access device 150 via the access interface 124, and the controller 120 may receive data from the access device 150 via the access interface 124. The controller 120 is configured to send data and commands to the memory 104 and to receive data from the memory 104. For example, the controller 120 is configured to send data and a write command to cause the memory 104 to store data to a specified address of the memory 104. The write command may specify a physical address of a portion of the memory 104 (e.g., a physical address of a word line of the memory 104) that is to store the data. The controller 120 is also configured to send a read command to the memory 104 to cause read data to be sent from the memory 104 to the controller 120. The read command may specify a physical address of a portion of the memory 104 (e.g., a physical address of a word line of the memory 104). The controller 120 may also be configured to send data and commands to the memory 104 associated with background scanning operations, garbage collection operations, wear leveling operations, relocation operations, etc., as illustrative, non-limiting examples. The controller 120 is also configured to designate one or more decode parameter values based on a traffic type associated with multiple read requests from the access device 150, as further described herein.

The controller 120 includes a traffic analyzer 162 that is configured to generate a traffic type indicator 170 based on multiple read requests from the access device 150. The traffic type indicator 170 may identify a traffic type associated with the multiple read requests. The traffic type may correspond to an access mode of the access device 150. As a particular example, a first traffic type may correspond to a sequential (or predominately sequential) access mode and the second traffic type may correspond to a non-sequential (or predominately non-sequential) access mode. As used herein, the non-sequential access mode may also be referred to as a "random" access mode. Although referred to as the "random access mode," during this mode the access device 150 may issue read requests including LBAs that are not randomly generated but that instead are predominately non-sequential. Each access mode may correspond to a performance characteristic that has a higher priority than other performance characteristics. Decode parameter adjustment values may be designated to improve or to "optimize" the performance characteristic, as described further herein. Such a performance characteristic is referred to herein as a leading performance criterion.

The traffic analyzer 162 is configured to determine the traffic type based on a pattern of the multiple read requests. To illustrate, the traffic analyzer 162 may determine whether the multiple read requests correspond to a first traffic type or a second traffic type. The traffic type indicator 170 may have a first value responsive to the multiple read requests corresponding to the first traffic type, and the traffic type indicator 170 may have a second value responsive to the multiple read requests corresponding to the second traffic type. Although two traffic types and two access modes are described, in other implementations there may be more than two traffic types and more than two access modes. The first traffic type corresponds to a first pattern and the second traffic type corresponds to a second pattern. The patterns may correspond to logical block addresses (LBAs) that are included in the multiple read requests, to command sizes of the multiple read requests, to some other characteristic of the multiple read requests, or to a combination thereof.

In a particular example, the first traffic type corresponds to read requests that include sequential LBAs and the second traffic type corresponds to read requests that include non-sequential (e.g., random) LBAs. The LBAs represent the locations from which to read data, as determined by the access device 150. The controller 120 may be configured to translate the LBAs into physical block addresses before issuing read commands to the memory device 103.

In another particular example, the first traffic type corresponds to read requests having first command sizes that are less than or equal to a threshold and the second traffic type corresponds to read requests having second command sizes that exceed the threshold. The threshold may be a command size that distinguishes between access modes at the access device 150, such as a sequential access mode and a random access mode. In a particular implementation, the threshold is 4 kilobytes (KB), the random access mode is associated with command sizes that are less than or equal to 4 KB, and the sequential access mode is associated with command sizes that exceed 4 KB. In other implementations, the threshold is a different command size.

In another particular example, the first traffic type corresponds to read requests that include an indicator having a first value, and the second traffic type corresponds to read requests that include an indicator having a second value. To illustrate, a payload of a read request may include an indicator, such as one or more bits, a flag, or another form of indicator. The traffic type of the read request may be indicated by the value of the indicator. For example, read requests including indicators having the first value may correspond to the first traffic type, and read requests including indicators having the second value may correspond to the second traffic type.

Although determining traffic types of multiple read requests has been described, a traffic type of a single read request or a single command may also be determined. For example, a read request may be classified as a particular traffic type based on a LBA in the read request. To illustrate, if the LBA matches a particular LBA (or an LBA within a particular range of LBAs), the read request may be classified as random access traffic. If the LBA does not match the particular LBA (or if the LBA does not match an LBA within the particular range of LBAs), the read request may be classified as sequential access traffic. As another example, a payload of the single read request may be analyzed to determine the traffic type of the single read request based on an indicator in the payload.

The traffic analyzer 162 is further configured to indicate the determined traffic type. For example, the traffic analyzer 162 may be configured to generate the traffic type indicator 170 that has a first value if the determined traffic type is the first traffic type and that has a second value if the determined traffic type is the second traffic type. The traffic analyzer 162 may include one or more bits that indicate the traffic type (e.g., one or more bits having the first value or the second value). In a particular implementation, the traffic type indicator 170 is included in a message or other data packet that is generated by the traffic analyzer 162. In another particular implementation, the traffic type indicator 170 a flag that is set by the traffic analyzer 162 based on the determined traffic type. For example, the flag (e.g., the traffic type indicator 170) may be a bit in a control register, a value on a signal line, or another form of flag. A value of the flag may indicate the traffic type. In a particular example, the flag is asserted to indicate sequential traffic and de-asserted to indicate random traffic. In other implementations, the flag may include more than one bit, the flag may be used to represent different traffic types, or both.

The controller 120 includes a parameter adjuster 164 that is configured to designate one or more decode parameter values 174 based on the traffic type. For example, the parameter adjuster 164 may be configured to designate the one or more decode parameter values 174 based on the traffic type indicator 170. The one or more decode parameter values 174 may include timeout parameter values, log likelihood ratio (LLR) values, decode mode parameter values, one or more other parameters, or a combination thereof. The parameter adjuster 164 may be configured to determine a leading performance criterion based on the traffic type and to designate the one or more decode parameter values 174 based on the leading performance criterion. Although the traffic analyzer 162 and the parameter adjuster 164 are described as separate components that are included in the controller 120, in other implementations, a single component (e.g., a parameter adjuster) may perform the operations of both the traffic analyzer 162 and the parameter adjuster 164 or the traffic analyzer 162 and the parameter adjuster 164 may be separate from the controller 120.

The parameter adjuster 164 may receive the traffic type indicator 170 that indicates the traffic type. The parameter adjuster 164 may be configured to determine a leading performance criterion associated with the one or more read requests based on the traffic type. The leading performance criterion may be referred to as a "leading performance requirement." To illustrate, the leading performance criterion may indicate a particular performance characteristic that is to satisfy a threshold or that is to be prioritized above other performance characteristics. Failure to satisfy the leading performance criterion may degrade performance of the access device 150. In a particular implementation, throughput is the leading performance criterion associated with a first traffic type (e.g., traffic that includes sequential LBAs or that has command sizes that exceed the threshold), and quality of service (QoS) (e.g., a guaranteed maximum delay of any individual read request) is the leading performance criterion associated with a second traffic type (e.g., traffic that includes non-sequential LBAs or that has command sizes that fail to exceed the threshold). In other implementations, other leading performance criterions may be determined based on these, or other, traffic types.

The parameter adjuster 164 is configured to designate one or more decode parameter values 174 based on the determined leading performance criterion. For example, the parameter adjuster 164 may designate a first set of decode parameter values that are associated with improved throughput when the leading performance criterion is throughput. As another example, the parameter adjuster 164 may designate a second set of decode parameter values that are associated with improved QoS when the leading performance criterion is QoS.

In a particular implementation, the parameter adjuster 164 is configured to generate and send a parameter adjustment message 172 that indicates the one or more decode parameter values 174. For example, the parameter adjustment message 172 may include the one or more decode parameter values 174. Alternatively, the parameter adjustment message 172 may indicate a location of the one or more decode parameter values 174. For example, the parameter adjustment message 172 may indicate one or more addresses of the one or more decode parameter values 174 in a memory, such as a controller memory, a decoder memory, or the memory 104, as non-limiting examples.

The controller 120 also includes an error correction code (ECC) engine that is configured to receive data to be stored at the memory 104 and to generate a codeword. For example, the ECC engine may include an encoder configured to encode data using an ECC scheme, such as a Reed-Solomon encoder, a Bose-Chaudhuri-Hocquenghem (BCH) encoder, a low-density parity check (LDPC) encoder, a Turbo Code encoder, an encoder configured to encode one or more other ECC encoding schemes, or a combination thereof, as illustrative, non-limiting examples. In a particular implementation, the ECC engine includes an LDPC encoder. The codeword may be sent from the controller 120 to the memory device 103 and stored at the memory 104.

The ECC engine may also be configured to receive data and to process the received data in accordance with one or more ECC decoding schemes. For example, the ECC engine may include an ECC decoder 166, such as a Reed Solomon decoder, a BCH decoder, an LDPC decoder, a Turbo Code decoder, a decoder configured to decode received data in accordance with one or more other ECC encoding schemes, or any combination thereof. In a particular implementation, the ECC decoder 166 is an LDPC decoder. The ECC decoder 166 may be configured to decode data read from the memory 104 to detect and correct, up to an error correction capability of the ECC scheme, any bit errors that may be present in the data. Operation of the ECC decoder 166 may be adjustable based on decode parameters 176.

The ECC decoder 166 may be configured to decode a representation of data from the memory 104 based on the one or more decode parameter values 174. To illustrate, the parameter adjuster 164 may be configured to send the parameter adjustment message 172 and the ECC decoder 166 may be configured to receive the parameter adjustment message 172. In some implementations, the ECC decoder 166 is configured to set or modify the decode parameters 176 based on the one or more decode parameter values 174 included in the parameter adjustment message 172. In other implementations, the location of the one or more decode parameter values 174 is indicated by the parameter adjustment message 172, and the ECC decoder 166 is configured to retrieve the one or more decode parameter values 174 (e.g., from a controller memory, a memory of the ECC decoder 166, or the memory 104) and to set or modify the decode parameters 176 based on the one or more decode parameter values 174. Although described as being included in the controller 120, in other implementations the ECC decoder 166 is separate from the controller 120.

During operation, the access device 150 issues read requests to the data storage device 102, such as the first plurality of read requests 152 and the second plurality of read requests 154. The controller 120 may receive the first plurality of read requests 152 and the second plurality of read requests 154, and the traffic analyzer 162 may process the read requests to identify or determine patterns associated with the read requests. For example, the traffic analyzer 162 may identify a first pattern 153 associated with the first plurality of read requests 152 and a second pattern 155 associated with the second plurality of read requests 154. To illustrate, the traffic analyzer 162 may process the read requests and identify the first pattern 153 and the second pattern 155 based on LBAs included the first plurality of read requests 152 and the second plurality of read requests 154, or based on command sizes of the first plurality of read requests 152 and the second plurality of read requests 154, or based on some other characteristic of the first plurality of read requests 152 and the second plurality of read requests 154, or a combination thereof.

The traffic analyzer 162 may determine a traffic type associated with the read requests based on the patterns. To illustrate, the traffic analyzer 162 may determine whether the read requests correspond to a first traffic type or a second traffic type at least partially based on addresses or command sizes associated with the read requests. As an illustrative, non-limiting example, the traffic analyzer 162 may determine that the first plurality of read requests 152 corresponds to the first traffic type based on a determination that the first pattern 153 is a pattern of sequential LBAs. As another illustrative, non-limiting example, the traffic analyzer 162 may determine that the second plurality of read requests 154 corresponds to the second traffic type (that is different than the first traffic type) based on a determination that the second pattern 155 is a pattern of non-sequential LBAs.

As another illustrative example, the traffic analyzer 162 may determine that the first plurality of read requests 152 corresponds to the first traffic type based on an analysis of payloads of the first plurality of read requests 152, and the traffic analyzer 162 may determine that the second plurality of read requests 154 corresponds to the second traffic type based on an analysis of payloads of the second plurality of read requests 154. To illustrate, the payload of each read request may contain an indicator (e.g., one or more bits, a flag, etc.) that indicates a traffic type of the read request, and the traffic analyzer 162 may analyze the payloads of read requests in order to classify the read requests according to traffic type.

As another illustrative, non-limiting example, the traffic analyzer 162 may monitor the first plurality of read requests 152 to determine whether the first plurality of read requests 152 includes a particular set of LBAs. In a particular implementation, the particular set of LBAs may be a static set of LBAs that are programmed in a memory, such as the memory 104 or a controller memory. In another particular implementation, the particular set of LBAs may be dynamically updated. For example, the controller 120 may monitor LBAs that are accessed by the access device 150 to generate a set of frequently accessed LBAs. The set of frequently accessed LBAs may be dynamically updated and stored during operation of the data storage device 102. The set of frequently accessed LBAs may be referred to as "hot" LBAs. When the LBAs included in the first plurality of read requests 152 do not match the particular set of LBAs (or when the number of LBAs that match the particular set of LBAs fails to exceed a threshold), the traffic analyzer 162 may determine that the first plurality of read requests 152 has the first traffic type (e.g., sequential traffic), and when the LBAs included in the first plurality of read requests 152 match the particular set of LBAs (or when the number of LBAs that match the particular set of LBAs exceeds the threshold), the traffic analyzer 162 may determine that the first plurality of read requests 152 has the second traffic type (e.g., random traffic).

The traffic analyzer 162 may indicate the traffic types corresponding to the read requests to the parameter adjuster 164. For example, the traffic analyzer 162 may generate the traffic type indicator 170 that indicates that the first plurality of read requests 152 corresponds to the first traffic type. Additionally, the traffic analyzer 162 may generate a second traffic type indicator that indicates that the second plurality of read requests 154 corresponds to the second traffic type. The traffic analyzer 162 may send the traffic type indicator 170 indicating the second traffic type for the second plurality of read requests 154 to the parameter adjuster 164. In other implementations, a single message (e.g., the traffic type indicator 170) may indicate the traffic type corresponding to the first plurality of read requests 152 and the traffic type corresponding to the second plurality of read requests 154.

The parameter adjuster 164 may receive the traffic type indicator 170 and may designate the one or more decode parameter values 174 based on the traffic type of the first plurality of read requests 152 indicated by the traffic type indicator 170. In order to designate the one or more decode parameter values 174, the parameter adjuster 164 may determine a leading performance criterion that corresponds to an access mode of the access device 150 that is associated with the traffic type. To illustrate, in response to determining that the first plurality of read requests 152 corresponds to the first traffic type, the parameter adjuster 164 may identify a leading performance criterion that corresponds to an access mode of the access device 150 that is indicated the first traffic type. As a particular example, in response to determining that the first plurality of read requests 152 corresponds to sequential access traffic (e.g., read requests that include sequential LBAs), the parameter adjuster 164 may identify throughput as the leading performance criterion.

Based on the identified leading performance criterion, the parameter adjuster 164 may designate the one or more decode parameter values 174 in order to improve or to optimize throughput of the ECC decoder 166 during a data decoding process that corresponds to the first plurality of read requests 152. For example, the parameter adjuster 164 may designate a value of a decode mode parameter that is associated with improving throughput, a value of a timeout parameter that is associated with improving throughput, a set of LLR values that is associated with improving throughput, or a combination thereof, as further described with reference to FIG. 2. In another implementation, decode parameter values that correspond to different leading performance criterions are stored at a memory (e.g., a controller memory, a decoder memory, the memory 104, etc.), and the parameter adjuster 164 determines the location of the one or more decode parameter values 174 at the memory.

The ECC decoder 166 sets or modifies the decode parameters 176 based on the one or more decode parameter values 174. For example, the ECC decoder 166 may modify one or more of the decode parameters 176 from current values to the one or more decode parameter values 174. After the decode parameters 176 are modified based on the one or more decode parameter values 174, the modified decode parameters 176 are used during a decoding process of data that corresponds to the first plurality of read requests 152. To illustrate, in response to the first plurality of read requests 152, the controller 120 may read a representation of first data 140 from the memory 104. The ECC decoder 166 may use the modified decode parameters 176 to improve performance of a decoding process of the representation of the first data 140. Improving the performance of the decoding process enables the ECC decoder 166 to meet a leading performance criterion that corresponds to the access mode of the access device 150 when the first plurality of read requests 152 are issued.

In a similar manner, the parameter adjuster 164 may designate additional parameter values based on a traffic type of the second plurality of read requests 154. As a particular example, in response to determining that the second plurality of read requests 154 corresponds to random access traffic (e.g., read requests that include non-sequential LBAs), the parameter adjuster 164 may identify QoS as the leading performance criterion. The parameter adjuster 164 may designate the additional decode parameter values to improve QoS at the ECC decoder 166. The ECC decoder 166 may set or modify the decode parameters 176 based on the additional decode parameter values to improve performance of a decoding process of a representation of second data 142 that is read from the memory 104 based on the second plurality of read requests 154.

Thus, the ECC decoder 166 is adjustable, based on one or more parameter values designated by the parameter adjuster 164, to improve performance of a decoding process. Because a traffic type of one or more read requests is indicative of an access mode of the access device 150, setting or modifying decode parameter values based on the traffic type of the read requests enhances the ability of the ECC decoder 166 to meet leading performance criterions of different access modes of the access device 150. Meeting leading performance criterions of different access modes of the access device 150 improves flexibility and utility of the data storage device 102 in addition to reducing latency and power consumption of the data storage device 102.

Figure 2:
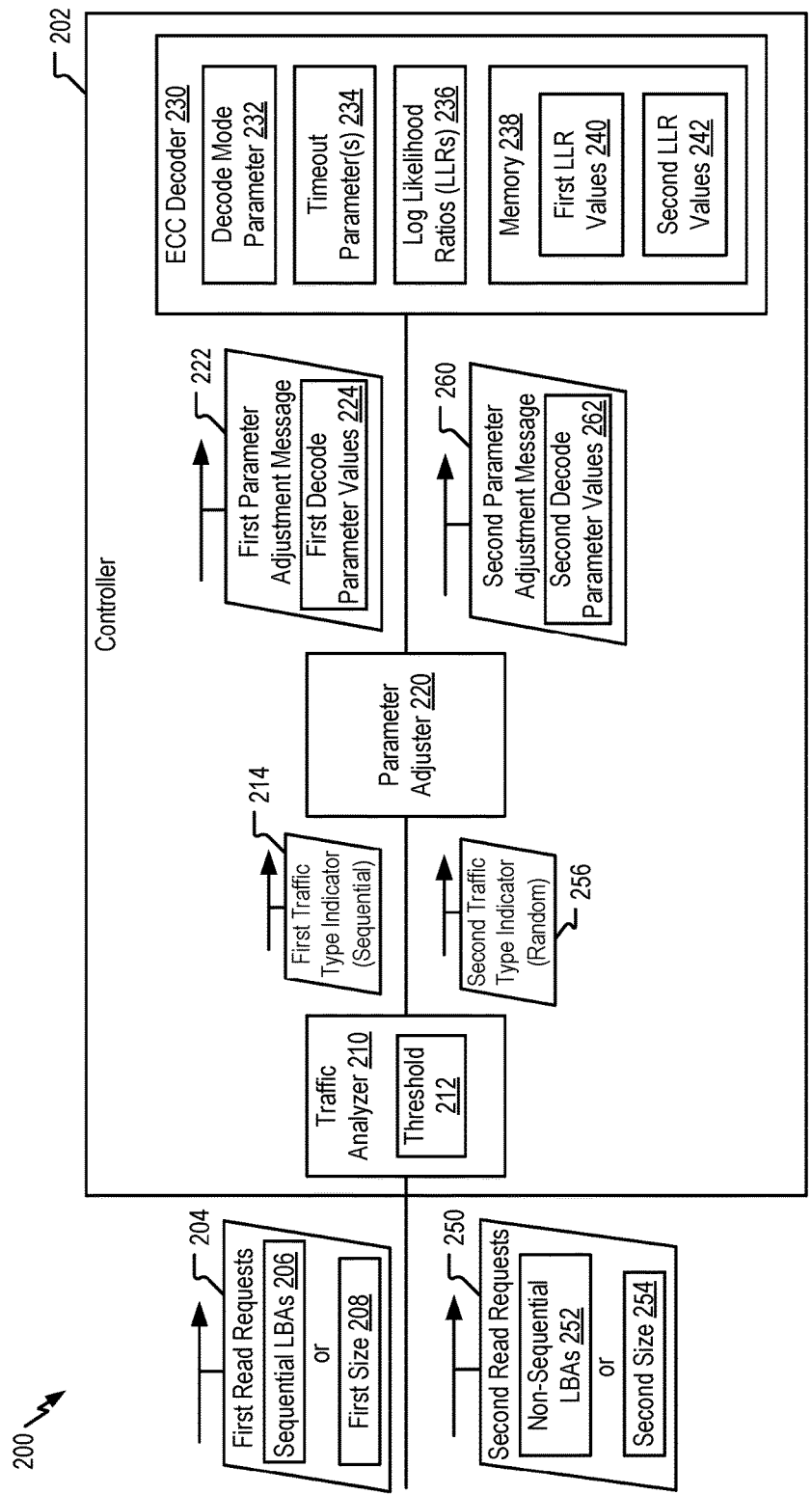
FIG. 2 is a block diagram of a system that is configured to set decode parameters to different values based on read requests having different patterns.

Referring to FIG. 2, an example of a system that is configured to set decode parameters to different values based on read requests having different patterns is shown and generally designated 200. The system 200 includes a controller 202 that includes a traffic analyzer 210, a parameter adjuster 220, and an ECC decoder 230. In a particular implementation, the controller 202, the traffic analyzer 210, the parameter adjuster 220, and the ECC decoder 230 correspond to the controller 120, the traffic analyzer 162, the parameter adjuster 164, and the ECC decoder 166 of FIG. 1, respectively. Although three components of the controller 202 are illustrated, in other implementations, the controller 202 may have more than three components or fewer than three components. For example, in other implementations, one component may be configured to perform the operations of two components, such as the traffic analyzer 210 and the parameter adjuster 220.

The traffic analyzer 210 is configured to determine a traffic type of read requests. For example, the traffic analyzer 210 may analyze a plurality of read requests and, based on LBAs included in the read requests, command sizes of the read requests, or some other characteristic of the read requests, the traffic analyzer 210 may determine a traffic type of the plurality of read requests. The traffic type may be sequential access traffic or random access traffic (e.g., non-sequential access traffic), as non-limiting examples. The traffic analyzer 210 is configured to provide an indication of the traffic type to the parameter adjuster 220.

The parameter adjuster 220 is configured to designate one or more decode parameter values based on the traffic type. For example, the parameter adjuster 220 may identify a leading performance criterion based on the traffic type and the traffic analyzer 210 may designate the one or more decode parameter values to improve or to optimize the identified leading performance criterion. The ECC decoder 230 is configured to decode representations of data based on the one or more parameter values.

During operation, the controller 202 may receive a first plurality of read requests 204. The first plurality of read requests 204 may be issued by an access device, such as the access device 150 of FIG. 1, as a non-limiting example. The traffic analyzer 210 analyzes the first plurality of read requests 204 to determine a first traffic type that corresponds to the first plurality of read requests 204. The first traffic type is based on a pattern of the first plurality of read requests 204.

As a first example, the traffic analyzer 210 may determine the first traffic type based on LBAs included in the first plurality of read requests 204. To illustrate, the first plurality of read requests 204 may include sequential LBAs 206. Based on the first plurality of read requests 204 including the sequential LBAs 206, the traffic analyzer 210 may determine that the first plurality of read requests 204 has a first traffic type (e.g., sequential traffic). As a second example, the traffic analyzer 210 may determine the first traffic type based on command sizes of the first plurality of read requests 204. To illustrate, the traffic analyzer 210 may compare a first command size 208 of the first plurality of read requests 204 to a threshold 212. Based on the first command size 208 exceeding the threshold 212, the traffic analyzer 210 may determine that the first plurality of read requests 204 has the first traffic type. The threshold 212 may be a command size that distinguishes between access modes at an access device, such as a sequential access mode and a random access mode.

The traffic analyzer 210 may communicate the identified first traffic type to the parameter adjuster 220. For example, the traffic analyzer 210 may send a first traffic type indicator 214 to the parameter adjuster 220. The first traffic type indicator 214 indicates the first traffic type corresponding to the first plurality of read requests 204. In the example of FIG. 2, the traffic types (e.g., sequential traffic, random traffic, etc.) correspond to access modes (e.g., sequential access, random access, etc.) of the access device. In other implementations, the traffic types may correspond to a leading performance criterion associated with the access mode (e.g., throughput-based traffic, QoS-based traffic, etc.).

The parameter adjuster 220 may receive the first traffic type indicator 214 and may designate one or more decode parameter values based on the first traffic type indicated by the first traffic type indicator 214. In some implementations, the parameter adjuster 220 may identify a leading performance criterion that corresponds to an access mode that caused the access device to issue the first plurality of read requests 204. For example, the parameter adjuster 220 may determine that the leading performance criterion is throughput based on an indication of sequential traffic (e.g., the first traffic type indicator 214). In other implementations, the leading performance criterion may be determined by the traffic analyzer 210, and the first traffic type indicator 214 may indicate the leading performance criterion (e.g., the first traffic type is throughput-based traffic).

After determining (or identifying) the leading performance criterion corresponding to the first plurality of read requests 204, the parameter adjuster 220 designates first decode parameter values 224. The first decode parameter values 224 may include decode mode parameter values, timeout parameter values, LLR values, or a combination thereof. The first decode parameter values 224 are selected to improve or optimize the leading performance criterion (e.g., throughput).

For example, the parameter adjuster 220 may designate a value of a decode mode parameter that is associated with increased throughput and decreased QoS. To illustrate, the ECC decoder 230 may have multiple decoding modes that differ in correction capability and energy consumption. As used herein, decoding modes are also referred to as decoding "gears."

In a particular implementation, the ECC decoder 230 is an LDPC decoder that has an ultra-low power (ULP) mode (e.g., a lowest power processing mode), a low power (LP) mode having increased processing power as compared to the ULP mode, and a full power (FP) mode (e.g., a highest power processing mode). The ECC decoder 230 may operate in multiple decoding modes during data decoding. For example, at the beginning of a data decoding process, the ECC decoder 230 may operate in the ULP mode, and if there is no convergence within a particular time period, the ECC decoder 230 may switch to operating in the LP mode. If a decode mode parameter has a first value, the ECC decoder 230 may be able to share data between the decoding modes. For example, output data that is generated by the ECC decoder 230 when operating in the ULP mode may be used as input data, such as soft bits or LLR values, by the ECC decoder 230 when operating in the LP mode. If the decode mode parameter has a second value, the ECC decoder 230 may be unable to share data between the decoding modes.

Sharing data between decoding modes at the ECC decoder 230 may improve throughput of the ECC decoder 230 during a decoding process. For example, sharing data between decoding modes may cause the ECC decoder 230 to converge faster on average (e.g., for decoding a majority of data, the ECC decoder 230 is faster when data sharing between decoding modes is enabled). However, sharing data between decoding modes at the ECC decoder 230 may degrade QoS of the ECC decoder 230 during the decoding process. For example, when the data contains outliers (e.g., the data has unexpected or different values from the majority of the data), sharing data between the decoding modes can cause the ECC decoder 230 to get "off track" and convergence takes longer (e.g., latency is increased). Because reducing a maximum latency may improve QoS, disabling data sharing between the decoding modes may improve QoS (while potentially degrading throughput). Thus, in response to determining that throughput is the leading performance criterion that corresponds to the first plurality of read requests 204, the parameter adjuster 220 may designate a decode mode parameter value that enables data sharing between decoding modes at the ECC decoder 230.

As another example, larger timeout parameter values (e.g., values indicating an amount of time before the ECC decoder 230 "times out" when operating in a particular decoding mode to decode data) may improve throughput but may degrade QoS, and smaller timeout values may degrade throughput but may improve QoS. For example, smaller timeout values may decrease a potential maximum latency, and larger timeout values may increase the amount of data that is decoded without error (e.g., improve throughput). Thus, in response to determining that throughput is the leading performance criterion that corresponds to the first plurality of read requests 204, the parameter adjuster 220 may designate larger timeout values. As another example, a first set of LLR values may improve throughput but may degrade QoS, and a second set of LLR values may degrade throughput but may improve QoS. Thus, in response to determining that throughput is the leading performance criterion that corresponds to the first plurality of read requests 204, the parameter adjuster 220 may designate the first LLR values to be used at the ECC decoder 230.

In a particular implementation, the parameter adjuster 220 determines the first decode parameter values 224. For example, the parameter adjuster 220 may store decode parameter values in a table or other data structure, and entries in the table may be indexed by the traffic type. Alternatively, the parameter adjuster 220 may be configured to calculate the first decode parameter values 224 using one or more equations or algorithms. The parameter adjuster 220 may generate a first parameter adjustment message 222 that includes the first decode parameter values 224. The parameter adjuster 220 may send the first parameter adjustment message 222 to the ECC decoder 230. In another implementation, decode parameter values that correspond to different leading performance criterions are stored at a memory or other location that is external to the parameter adjuster 220. The parameter adjuster 220 may determine the locations of the first decode parameter values 224, and the first parameter adjustment message 222 may indicate the locations.

The ECC decoder 230 receives the first parameter adjustment message 222 and modifies or sets decode parameters based on the first decode parameter values 224. To illustrate, the ECC decoder 230 may store values of multiple decode parameters that include a decode mode parameter 232, one or more timeout parameters 234, LLRs 236, other parameters, or a combination thereof. The decode mode parameter 232 may indicate whether data sharing between decoding modes of the ECC decoder 230 is enabled. The timeout parameters 234 may indicate an amount of time before the ECC decoder 230 "times out" during a decoding process.

Each decoding mode of the ECC decoder 230 may have a corresponding timeout parameter value or at least some decoding modes of the ECC decoder 230 may share a timeout parameter. The LLRs 236 may be used as input data by the ECC decoder 230 during a decoding process. In some implementations, the ECC decoder 230 includes a memory 238 that stores LLR values, such as first LLR values 240 (e.g., a first set of LLR values corresponding to a first mapping of hard bits and soft bits of read data to LLR values) and second LLR values 242 (e.g., a second set of LLR values corresponding to a second mapping of hard bits and soft bits of read data to LLR values). The first LLR values 240 may improve throughput but may degrade QoS, and the second LLR values 242 may degrade throughput but may improve QoS.

The ECC decoder 230 may set one or more of the decode parameters 232-236 based on the first decode parameter values 224. Setting one or more of the decode parameters 232-236 includes assigning a value to a parameter (if a value is not already assigned) or changing (e.g., modifying) a current value of the parameter to a new value. If the first decode parameter values 224 include a decode mode parameter value, the ECC decoder 230 may set the decode mode parameter 232 based on the decode mode parameter value included in the first decode parameter values 224. For example, because the first traffic type is sequential, the ECC decoder 230 may set the decode mode parameter 232 to a value that enables data sharing between decoding modes. If the first decode parameter values 224 include timeout values, the ECC decoder 230 may set the timeout parameters 234 based on the first decode parameter values 224. For example, because the first traffic type is sequential, the ECC decoder 230 may set the timeout parameters 234 to larger values (as compared to timeout values associated with improving QoS). If the first decode parameter values 224 include LLR values, the ECC decoder 230 may set the LLRs 236 based on the decode mode parameter value included in the first decode parameter values 224. In a particular implementation, the ECC decoder 230 may access the memory 238 and retrieve LLR values from a location indicated by the first parameter adjustment message 222. For example, because the first traffic type is sequential, the ECC decoder 230 may set the LLRs 236 to the first LLR values 240. In another implementation, the parameter adjuster 220 (or the ECC decoder 230) may calculate the LLR values based on one or more equations or rules that are associated with improving throughput.

After the decode parameters 232-236 are set, the ECC decoder 230 may decode a representation of data based on the decode parameters 232-236. For example, the controller 202 may receive a first representation of data that is stored at locations indicated by the first plurality of read requests 204, and the ECC decoder 230 may decode the first representation of data in accordance with the values of the decode parameters 232-236. Because the values of the decode parameters 232-236 are selected based on the first traffic type, throughput of the ECC decoder 230 during decoding of the first representation of data may be increased, as compared to decoding the first representation of data when the decode parameters 232-236 have other values.

Subsequently, the controller 202 may receive a second plurality of read requests 250. The traffic analyzer 210 analyzes the second plurality of read requests 250 to identify a pattern of the second plurality of read requests 250 and to determine a second traffic type that corresponds to the second plurality of read requests 250. As a first example, the traffic analyzer 210 may determine the second traffic type based on LBAs included in the second plurality of read requests 250. To illustrate, the second plurality of read requests 250 may include non-sequential LBAs 252. Based on the second plurality of read requests 250 including the non-sequential LBAs 252, the traffic analyzer 210 may determine that the second plurality of read requests 250 has a second traffic type (e.g., random traffic). As a second example, the traffic analyzer 210 may determine that the second plurality of read requests 250 have the second traffic type based on a second command size 254 of the second plurality of read requests 250 failing to exceed the threshold 212. The second command size 254 fails to exceed the threshold 212 when the second command size 254 is less than or equal to the threshold 212. The traffic analyzer 210 may send a second traffic type indicator 256 to the parameter adjuster 220 to indicate to the parameter adjuster 220 that the second plurality of read requests 250 correspond to the second traffic type (e.g., random traffic).

The parameter adjuster 220 may receive the second traffic type indicator 256 and may designate one or more decode parameter values based on the second traffic type indicated by the second traffic type indicator 256. For example, the parameter adjuster 220 may identify that QoS is the leading performance criterion associated with random traffic, and the parameter adjuster 220 may designate second decode parameter values 262 to improve or optimize the leading performance criterion (e.g., QoS). For example, the second decode parameter values 262 may include a decode mode parameter having a value that causes data sharing between decoding modes of the ECC decoder 230 to be disabled, time out values that are smaller (as compared to timeout values associated with improving throughput), LLR values associated with improving QoS (e.g., the second LLR values 242), or a combination thereof. In some implementations, at least one decoding mode may exceed QoS criterions. For example, the ULP mode may not be able to meet certain QoS criterions due to the nature of the decoding performed during the ULP mode. In these implementations, the timeout value for the ULP mode may be set to zero to prevent the ECC decoder 230 from operating in the ULP mode.

The parameter adjuster 220 may send, to the ECC decoder 230, a second parameter adjustment message 260 that includes the second decode parameter values 262 or that indicates the locations of the second decode parameter values 262. The ECC decoder 230 may set one or more of the parameters based on the second decode parameter values 262.

After the decode parameters 232-236 are set, the ECC decoder 230 may decode a representation of data based on the decode parameters 232-236. For example, the controller 202 may receive a second representation of data that is stored at locations indicated by the second plurality of read requests 250, and the ECC decoder 230 may decode the second representation of data in accordance with the values of the decode parameters 232-236. Because the values of the decode parameters 232-236 are selected based on the second traffic type, QoS of the ECC decoder 230 during decoding of the second representation of data may be increased, as compared to decoding the second representation of data when the decode parameters 232-236 have other values. Additionally, decoding the second representation of data may have a different latency than decoding the first representation of data. To illustrate, when the decode parameters 232-236 are set to improve throughput, an average latency is decreased, but certain cases (e.g., outliers) may take a long period of time to decode (e.g., a potential maximum latency may be increased). When the decode parameters 232-236 are set to improve QoS, an average latency may be increased, but the potential maximum latency (e.g., the latency associated with outliers) may be decreased.

In this manner, the ECC decoder 230 is dynamically configurable to improve a particular performance characteristic based on traffic type. Dynamically configuring the ECC decoder 230 based on traffic type enables the ECC decoder 230 to match multiple different performance criterions. Thus, the ECC decoder 230 has increased utility and flexibility as compared to ECC decoders that are designed to meet a single performance criterion.

Figure 3:
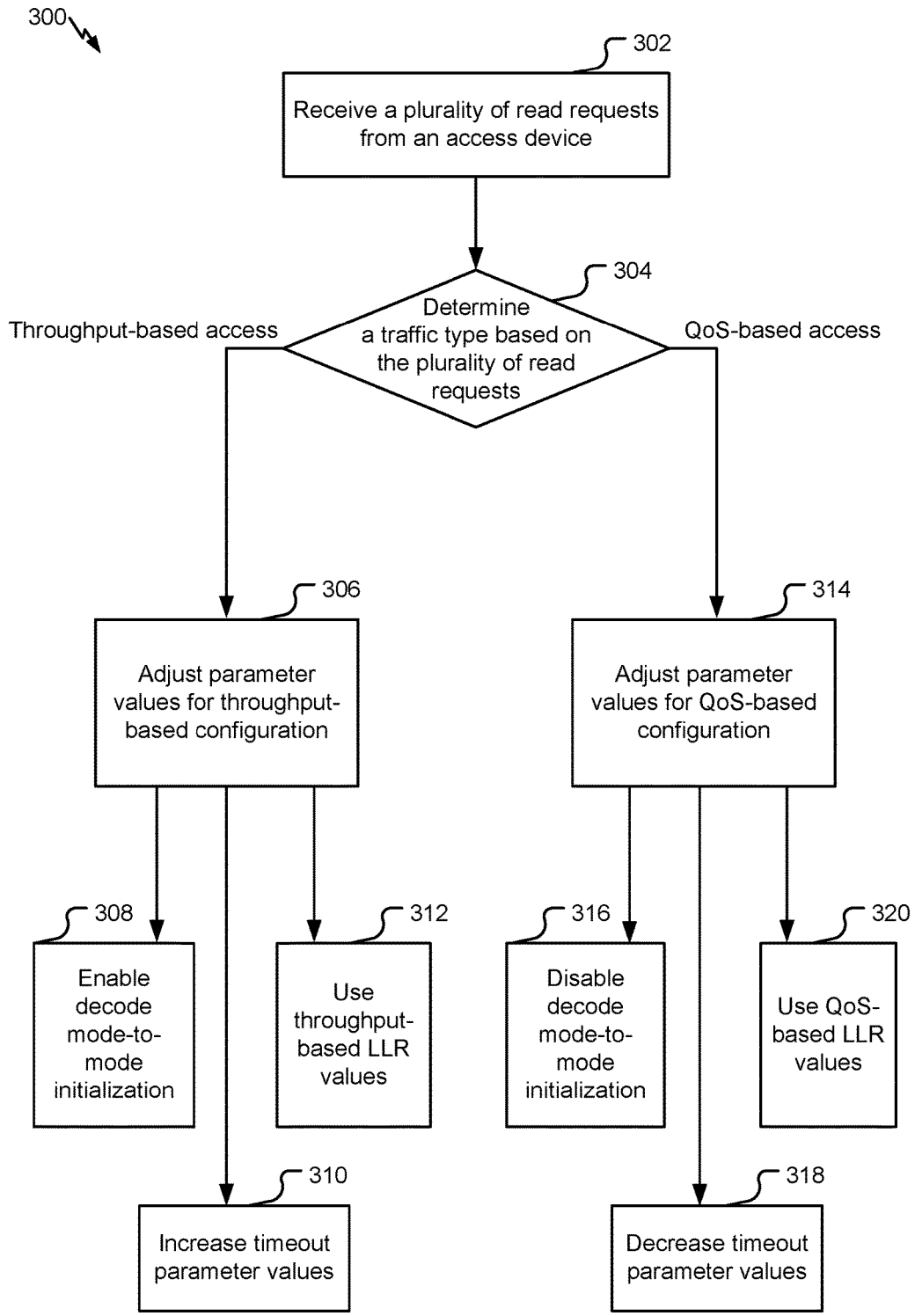
FIG. 3 is a flow diagram that illustrates an example of a method of setting decode parameter values based on traffic type.

Referring to FIG. 3, a particular illustrative example of a method 300 of setting decode parameter values based on traffic type is shown. The method 300 may be performed at a data storage device, such as the controller 120 of the data storage device 102 of FIG. 1.

The method 300 includes receiving a plurality of read requests from an access device, at 302. For example, the plurality of read requests may include the first plurality of read requests 152 or the second plurality of read requests 154 of FIG. 1, or the first plurality of read requests 204 or the second plurality of read requests 250 of FIG. 2.

The method 300 includes determining a traffic type based on the plurality of read requests, at 304. For example, the traffic analyzer 162 of FIG. 1 may analyze the plurality of read requests and determine the traffic type based on characteristic of the read requests, such as LBAs, command sizes, or another characteristic. If the traffic type is throughput-based traffic (e.g., sequential traffic), the method 300 continues to 306. If the traffic type is QoS-based traffic (e.g., random traffic), the method 300 continues to 314.

The method 300 includes adjusting parameter values for throughput-based configuration, at 306. For example, the parameter adjuster 164 of FIG. 1 may designate one or more decode parameter values based on the traffic type of the plurality of read requests, and the ECC decoder 166 of FIG. 1 may set or modify decode parameters based on the one or more decode parameter values. The one or more decoder parameter values improve throughput of the ECC decoder. The method 300 may continue to one or more of 308-312.

For example, the method 300 may include enabling decode mode-to-mode initialization, at 308. For example, a decode mode parameter may be set to a particular value that enables data sharing between decoding modes (e.g., mode-to-mode initialization) at the ECC decoder 166 of FIG. 1. The method 300 may include increasing timeout parameter values, at 310. For example, the timeout parameter values for different decoding modes at the ECC decoder 166 of FIG. 1 may be increased (as compared to current values). The method 300 may include using throughput-based LLR values, at 312. For example, a set of LLR values that enable increased throughput at the ECC decoder 166 of FIG. 1 may be used as input data for the ECC decoder 166.

Returning to 314, the method includes adjusting parameter values for QoS-based configuration, at 314. For example, the parameter adjuster 164 of FIG. 1 may designate one or more decode parameter values based on the traffic type of the plurality of read requests, and the ECC decoder 166 of FIG. 1 may set or modify decode parameters based on the one or more decode parameter values. The one or more parameter values improve QoS at the ECC decoder. The method 300 may continue to one or more of 316-320.

For example, the method 300 may include disabling decode mode-to-mode initialization, at 316. For example, a decode mode parameter may be set to a particular value that disables data sharing between decoding modes (e.g., mode-to-mode initialization) at the ECC decoder 166 of FIG. 1.

The method 300 may include decreasing timeout parameter values, at 318. For example, the timeout parameter values for different decoding modes at the ECC decoder 166 of FIG. 1 may be decreased (as compared to current values). The method 300 may include using QoS-based LLR values, at 320. For example, a set of LLR values that enable increased QoS at the ECC decoder 166 of FIG. 1 may be used as input data for the ECC decoder 166.

After one or more decode parameter values are set at 308-312 or 316-320, a representation of data is decoded based on the decode parameter values. A particular performance characteristic (e.g., throughput or QoS) may be improved during the decoding process due to the decode parameter values. Improving different performance characteristics for different traffic types may enable an ECC decoder to meet different performance criterions of access modes that correspond the different traffic types.

Figure 4:
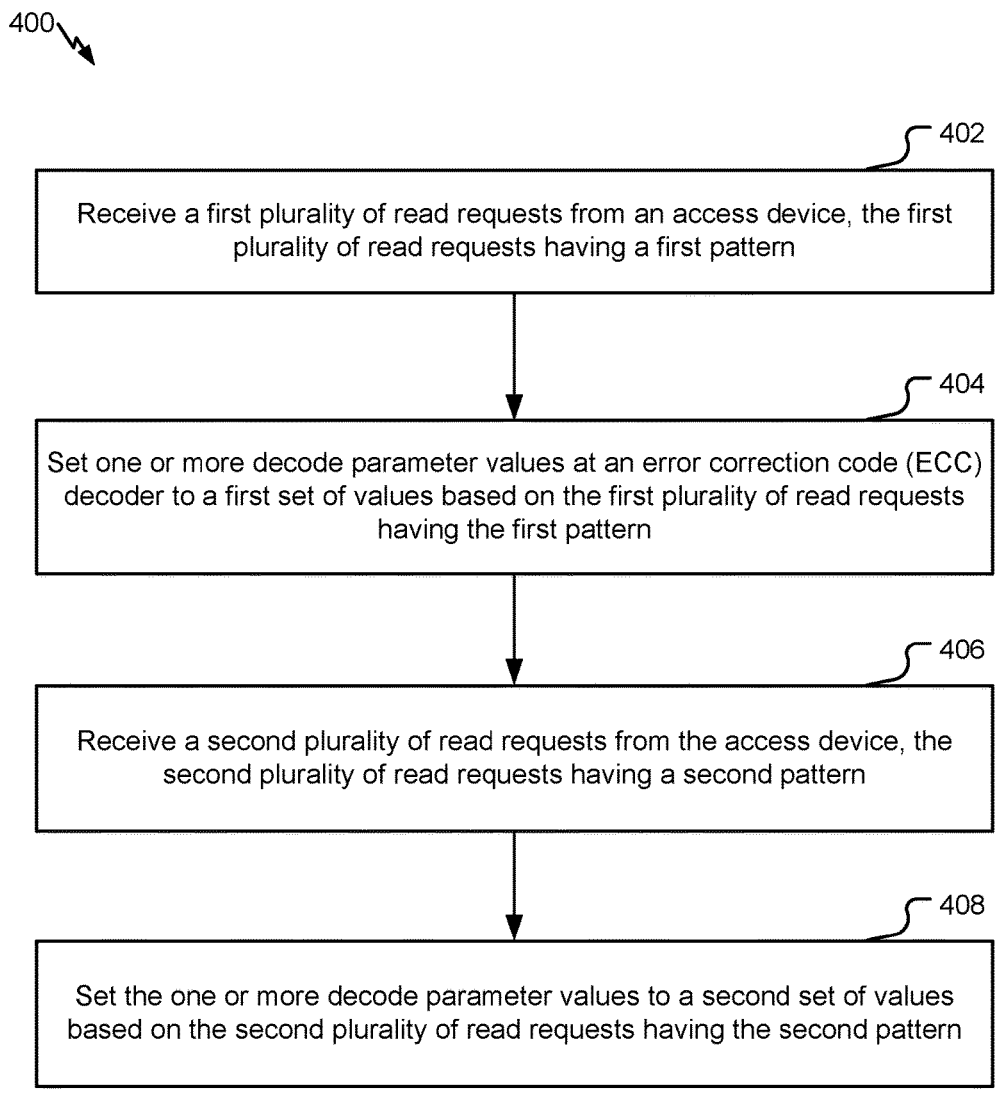
FIG. 4 is a flow diagram that illustrates an example of a method of setting decode parameters based on patterns of read requests.

Referring to FIG. 4, a particular illustrative example of a method 400 of setting decode parameters based on patterns of read requests is shown. The method 400 may be performed at a data storage device, such as at the controller 120 of the data storage device 102 of FIG. 1.

The method 400 includes receiving a first plurality of read requests from an access device, the first plurality of read requests having a first pattern, at 402. For example, the first plurality of read requests may include or correspond to the first plurality of read requests 152 of FIG. 1 or the first plurality of read requests 204 of FIG. 2, and the first pattern may include or correspond to the first pattern 153 of FIG. 1 or the sequential LBAs 206 or the first command size 208 of FIG. 2.

The method 400 includes setting one or more decode parameter values at an error correction code (ECC) decoder to a first set of values based on the first plurality of read requests having the first pattern, at 404. For example, the ECC decoder may include or correspond to the ECC decoder 166 of FIG. 1 or the ECC decoder 230 of FIG. 2, and the first set of values may include or correspond to the one or more decode parameter values 174 of FIG. 1 or the first decode parameter values 224 of FIG. 2.

The method 400 includes receiving a second plurality of read requests from the access device, the second plurality of read requests having a second pattern, at 406. For example, the second plurality of read requests may include or correspond to the second plurality of read requests 154 of FIG. 1 or the second plurality of read requests 250 of FIG. 2, and the second pattern may include or correspond to the second pattern 155 of FIG. 1 or the non-sequential LBAs 252 or the second command size 254 of FIG. 2.

The method 400 further includes setting the one or more decode parameter values to a second set of values based on the second plurality of read requests having the second pattern, at 408. For example, the second set of values may include or correspond to the additional decode parameters of FIG. 1 or the second decode parameter values 262 of FIG. 2.

In a particular example, the first pattern corresponds to a throughput-based decode scheme, and the second pattern corresponds to a quality of service (QoS)-based decode scheme. The first pattern may include a pattern of sequential logical block addresses, and the second pattern may include a pattern of non-sequential logical block addresses. The first set of values may include a first decode mode parameter value that enables data sharing between multiple decoding modes of the ECC decoder, and the second set of values may include a second decode mode parameter value that disables data sharing between the multiple decoding modes. For example, the decode mode parameter 232 of FIG. 2 may be set to a first value that enables data sharing between multiple decoding modes when the traffic type is sequential traffic (e.g., the traffic type is throughput-based traffic), and the decode mode parameter 232 may be set to a second value that disables data sharing between multiple decoding modes when the traffic type is random traffic (e.g., the traffic type is QoS-based traffic). Additionally or alternatively, the first set of values may include a first timeout parameter value corresponding to a decoding mode of the ECC decoder, and the second set of values may include a second timeout parameter value that corresponds to a shorter timeout duration than the first timeout parameter value. For example, the timeout parameter 234 of FIG. 2 may be increased when the traffic type is sequential traffic, and the timeout parameter 234 may be decreased when the traffic type is random traffic. Additionally or alternatively, the first set of values may include a first set of LLR values, and the second set of values may include a second set of LLR values that is different than the first set of LLR values. For example, the first set of LLR values may include or correspond to the first LLR values 240 of FIG. 2, and the second set of LLR values may include or correspond to the second LLR values 242 of FIG. 2. The first LLR values 240 may improve throughput, and the second LLR values 242 may improve QoS.

In a particular implementation, the method 400 includes decoding a first representation of data corresponding to the first plurality of read requests based on the first set of values and decoding a second representation of data corresponding to the second plurality of read requests based on the second set of values. For example, the ECC decoder 230 of FIG. 2 may decode a first representation of data corresponding to the first plurality of read requests 204 based on the first decode parameter values 224, and the ECC decoder 230 may decode a second representation of data corresponding to the second plurality of read requests 250 based on the second decode parameter values 262. Decoding the first representation of data may have a first latency, and decoding the second representation of data have a second latency. The first latency may be different than the second latency.

In another particular implementation, the first pattern may be identified based on the first plurality of read requests including one or more indicators having a first value, and the second pattern may be identified based on the second plurality of read requests including one or more indicators having a second value. For example, an indicator (e.g., one or more bits, a flag, etc.) may be included in a payload of a read request, and the traffic type of the read request may be indicated by the value of the indicator.

The method 400 may improve different performance characteristics of an ECC decoder for different traffic types. For example, the method 400 may improve throughput of the ECC decoder during decoding of data corresponding to sequential traffic, and the method 400 may improve QoS of the ECC decoder during decoding of data corresponding to random traffic. Improving different performance characteristics for different traffic types may enable the ECC decoder to meet leading performance criterions of multiple access modes of an access device, thereby increasing utility of the ECC decoder as compared to ECC decoders that are designed to improve a single performance characteristic at all times.

The method 300 of FIG. 3, the method 400 of FIG. 4, or a combination thereof, may be initiated or controlled by an application-specific integrated circuit (ASIC), a processing unit, such as a central processing unit (CPU), a controller, another hardware device, a firmware device, a field-programmable gate array (FPGA) device, or any combination thereof. As an example, the method 300 of FIG. 3, the method 400 of FIG. 4, or a combination thereof, can be initiated or controlled by one or more processors, such as one or more processors included in or coupled to a controller or a memory of the data storage device 102 and/or the access device 150 of FIG. 1. As an example, the method 300 of FIG. 3, the method 400 of FIG. 4, or a combination thereof, individually or in combination, may be performed by the controller 120 of FIG. 1. To illustrate, a portion of the method 300 of FIG. 3 or a portion of the method 400 of FIG. 4 may be combined with other operations described herein. Additionally, one or more operations described with reference to FIGS. 3-4 may be optional, may be performed at least partially concurrently, and/or may be performed in a different order than shown or described.

In an illustrative example, a processor may be programmed to receive a first plurality of read requests from an access device, to set one or more decode parameter values at an ECC decoder to a first set of values based on the first plurality of read requests having a first pattern, to receive a second plurality of read requests from the access device, and to set the one or more decode parameter values to a second set of values based on the second plurality of read requests having a second pattern. For example, the processor may execute instructions to receive a first plurality of read requests from an access device and to set one or more decode parameter values at an ECC decoder to a first set of values based on the first plurality of read requests having the first pattern. The processor may further execute instructions to receive a second plurality of read requests from the access device and to set the one or more decode parameter values at the ECC decoder to a second set of values based on the second plurality of read requests having the second pattern.

Figure 5:
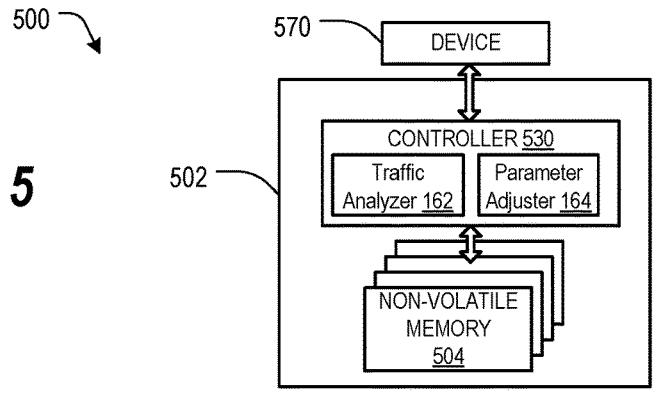
FIG. 5 is a block diagram of a particular illustrative implementation of a non-volatile memory system.

Referring to FIG. 5, a system 500 includes a non-volatile memory system 502 (e.g., the data storage device 102) that may be coupled to a device 570 (e.g., the access device 150). The non-volatile memory system 502 includes a controller 530 (e.g., the controller 120) and non-volatile memory that may be made up of one or more non-volatile memory dies 504 (e.g., one or more memory dies included in the memory 104). As used herein, the term "memory die" refers to the collection of non-volatile memory cells, and associated circuitry for managing the physical operation of those non-volatile memory cells, that are formed on a single semiconductor substrate. The controller 530 interfaces with the device 570 and transmits command sequences for read, program, and erase operations to the one or more non-volatile memory dies 504. The controller 530 includes the traffic analyzer 162 and the parameter adjuster 164.

The controller 530 (which may be a flash memory controller) may take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 530 may be configured with hardware and/or firmware to perform the various functions described above and shown in the flow diagrams. Also, some of the components shown as being internal to the controller 530 can be stored external to the controller 530, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory, map out bad flash memory cells, and allocate spare cells to be substituted for future failed cells. Some part of the spare cells can be used to hold firmware to operate the flash memory controller and implement other features. In operation, when a host device is to read data from or write data to the flash memory, the host device communicates with the flash memory controller. If the host device provides a logical address to which data is to be read/written, the flash memory controller can convert the logical address received from the host device to a physical address in the flash memory. (Alternatively, the host device can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The one or more non-volatile memory dies 504 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between the controller 530 and the one or more non-volatile memory dies 504 may be any suitable flash interface, such as Toggle Mode 200, 400, or 800. In one implementation, the non-volatile memory system 502 may be a card based system, such as a secure digital (SD) or a micro secure digital (micro-SD) card. In an alternate implementation, the non-volatile memory system 502 may be part of an embedded memory system.

Although, in the example illustrated in FIG. 5, the non-volatile memory system 502 (sometimes referred to herein as a storage module) includes a single channel between the controller 530 and the one or more non-volatile memory dies 504, the subject matter described herein is not limited to having a single memory channel. For example, in some NAND memory system architectures, 2, 4, 8 or more NAND channels may exist between the controller 530 and the NAND memory device, depending on controller capabilities. In any of the embodiments described herein, more than a single channel may exist between the controller 530 and the one or more non-volatile memory dies 504, even if a single channel is shown in the drawings.

Figure 6:
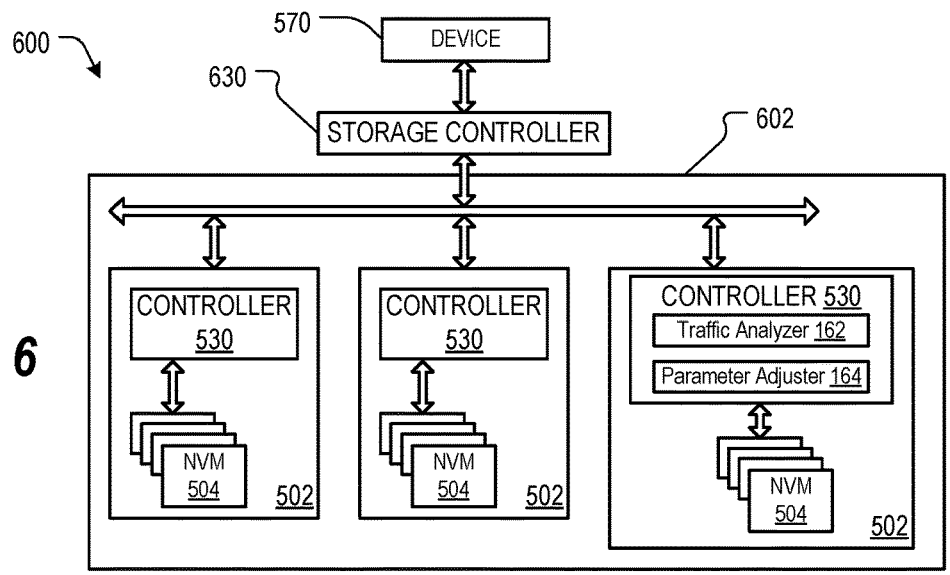
FIG. 6 is a block diagram of a particular illustrative implementation of a storage module including a plurality of the non-volatile memory systems of FIG. 5.

FIG. 6 illustrates a storage system 600 that includes multiple non-volatile memory systems 502. As such, storage system 600 may include a storage controller 630 that interfaces with the device 570 (e.g., a host device) and with a storage system 602, which includes a plurality of non-volatile memory systems 502. The interface between the storage controller 630 and the non-volatile memory systems 502 may be a bus interface, such as a serial advanced technology attachment (SATA) or peripheral component interface express (PCIe) interface. The storage system 600 may correspond to a solid state drive (SSD), such as found in portable computing devices, such as laptop computers, and tablet computers. One or more of the controllers 530 of FIG. 6 may include the traffic analyzer 162 and the parameter adjuster 164. Alternatively or in addition, the storage controller 630 may include the traffic analyzer 162 and the parameter adjuster 164.

Figure 7:
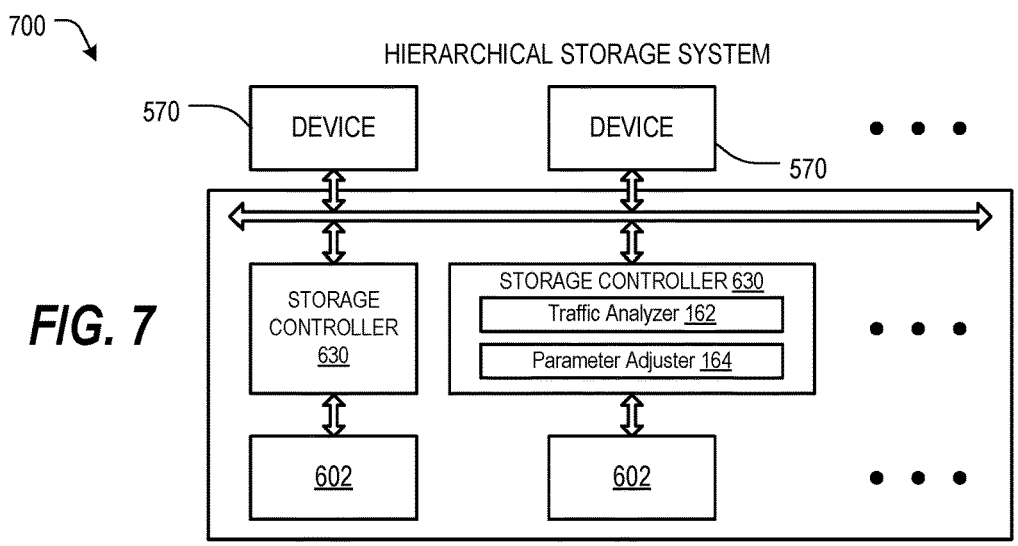
FIG. 7 is a block diagram of a particular illustrative implementation of a hierarchical storage system.

FIG. 7 is a block diagram illustrating a hierarchical storage system 700. The hierarchical storage system 700 includes a plurality of storage controllers 630, each of which controls a respective storage system 602. Devices 570 (e.g., one or more host devices or accessing devices) may access memories within the hierarchical storage system 700 via a bus interface. In one implementation, the bus interface may be an NVMe or fiber channel over Ethernet (FCoE) interface. In one implementation, the hierarchical storage system 700 illustrated in FIG. 7 may be a rack mountable mass storage system that is accessible by multiple host computers, such as would be found in a data center or other location where mass storage is needed. One or more storage controllers 630 of FIG. 7 may include the traffic analyzer 162 and the parameter adjuster 164.

Figure 8:
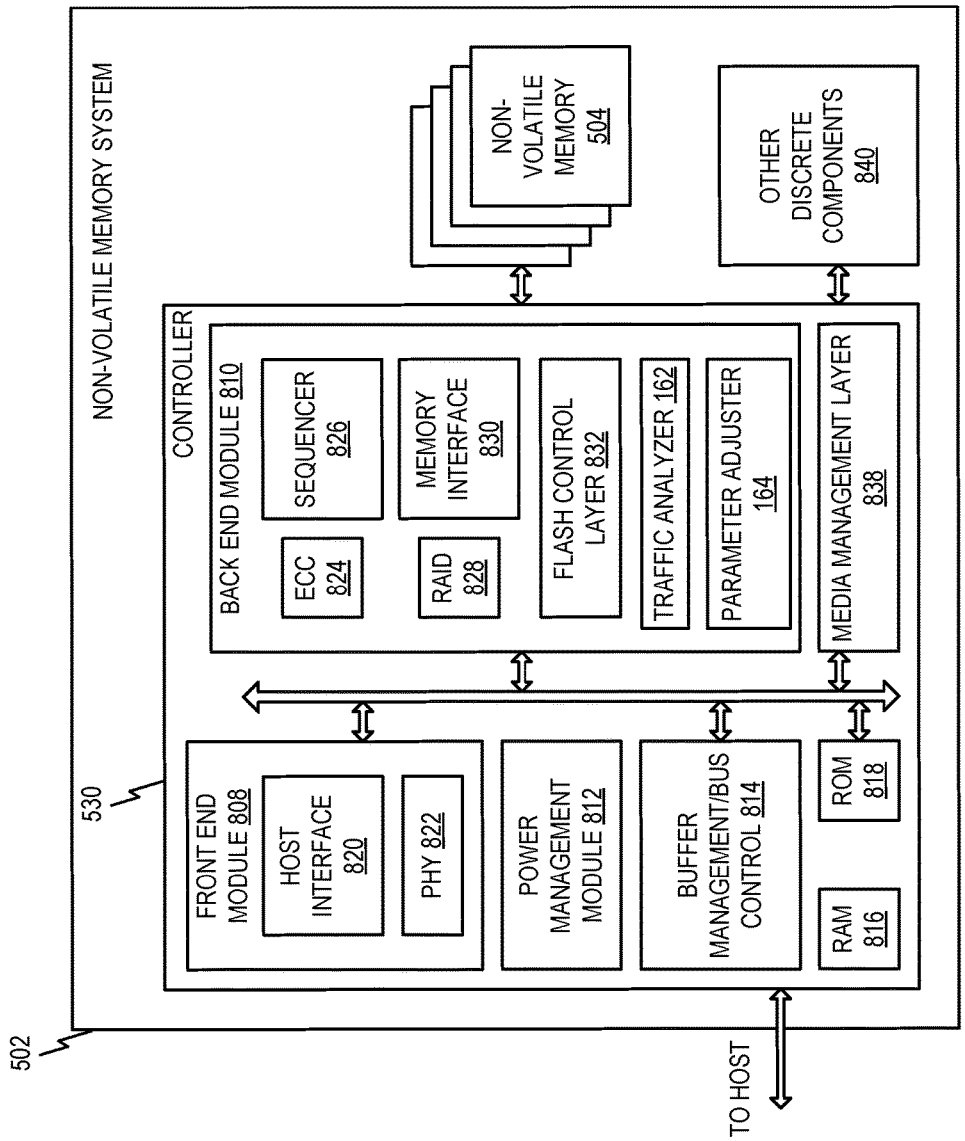
FIG. 8 is a block diagram of components of a particular illustrative implementation of a controller.

FIG. 8 is a block diagram illustrating exemplary components of the controller 530 of the non-volatile memory system 502 in more detail. The controller 530 may include the traffic analyzer 162 and the parameter adjuster 164. The controller 530 also includes a front end component 808 that interfaces with a host device, a back end component 810 that interfaces with the one or more non-volatile memory dies 504, and various other modules that perform other functions. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Referring again to the controller 530, a buffer manager/bus controller 814 manages buffers in random access memory (RAM) 816 and controls the internal bus arbitration of the controller 530. A read only memory (ROM) 818 stores system boot code. Although illustrated in FIG. 8 as located within the controller 530, in other embodiments one or both of the RAM 816 and the ROM 818 may be located externally to the controller 530. In yet other embodiments, portions of RAM and ROM may be located both within the controller 530 and outside the controller 530.

Front end component 808 includes a host interface 820 and a physical layer interface (PHY) 822 that provide the electrical interface with the host device or next level storage controller. The choice of the type of host interface 820 can depend on the type of memory being used. Examples of host interfaces 820 include, but are not limited to, SATA, SATA Express, SAS, Fibre Channel, USB, PCIe, and NVMe. The host interface 820 typically facilitates transfer for data, control signals, and timing signals.

Back end component 810 includes an error correcting code (ECC) engine 824 that encodes the data received from the host device, and decodes and error corrects the data read from the non-volatile memory. A command sequencer 826 generates command sequences, such as program and erase command sequences, to be transmitted to the one or more non-volatile memory dies 504. A RAID (Redundant Array of Independent Drives) component 828 manages generation of RAID parity and recovery of failed data. The RAID parity may be used as an additional level of integrity protection for the data being written into the one or more non-volatile memory dies 504. In some cases, the RAID component 828 may be a part of the ECC engine 824. A memory interface 830 provides the command sequences to the non-volatile memory dies 504 and receives status information from the one or more non-volatile memory dies 504. For example, the memory interface 830 may be a double data rate (DDR) interface, such as a Toggle Mode 200, 400, or 800 interface. A flash control layer 832 controls the overall operation of back end component 810.

Additional components of the non-volatile memory system 502 illustrated in FIG. 8 include a power management component 812 and a media management layer 838, which performs wear leveling of memory cells of the one or more non-volatile memory dies 504. The non-volatile memory system 502 may also include one or more other components or features illustrated with reference to FIG. 1, such as the traffic analyzer 162 and the parameter adjuster 164, as an illustrative example. Non-volatile memory system 502 also includes other discrete components 840, such as external electrical interfaces, external RAM, resistors, capacitors, or other components that may interface with the controller 530. In alternative embodiments, one or more of the physical layer interface 822, RAID component 828, media management layer 838 and buffer management/bus controller 814 are optional components that are omitted from the controller 530.

Figure 9:
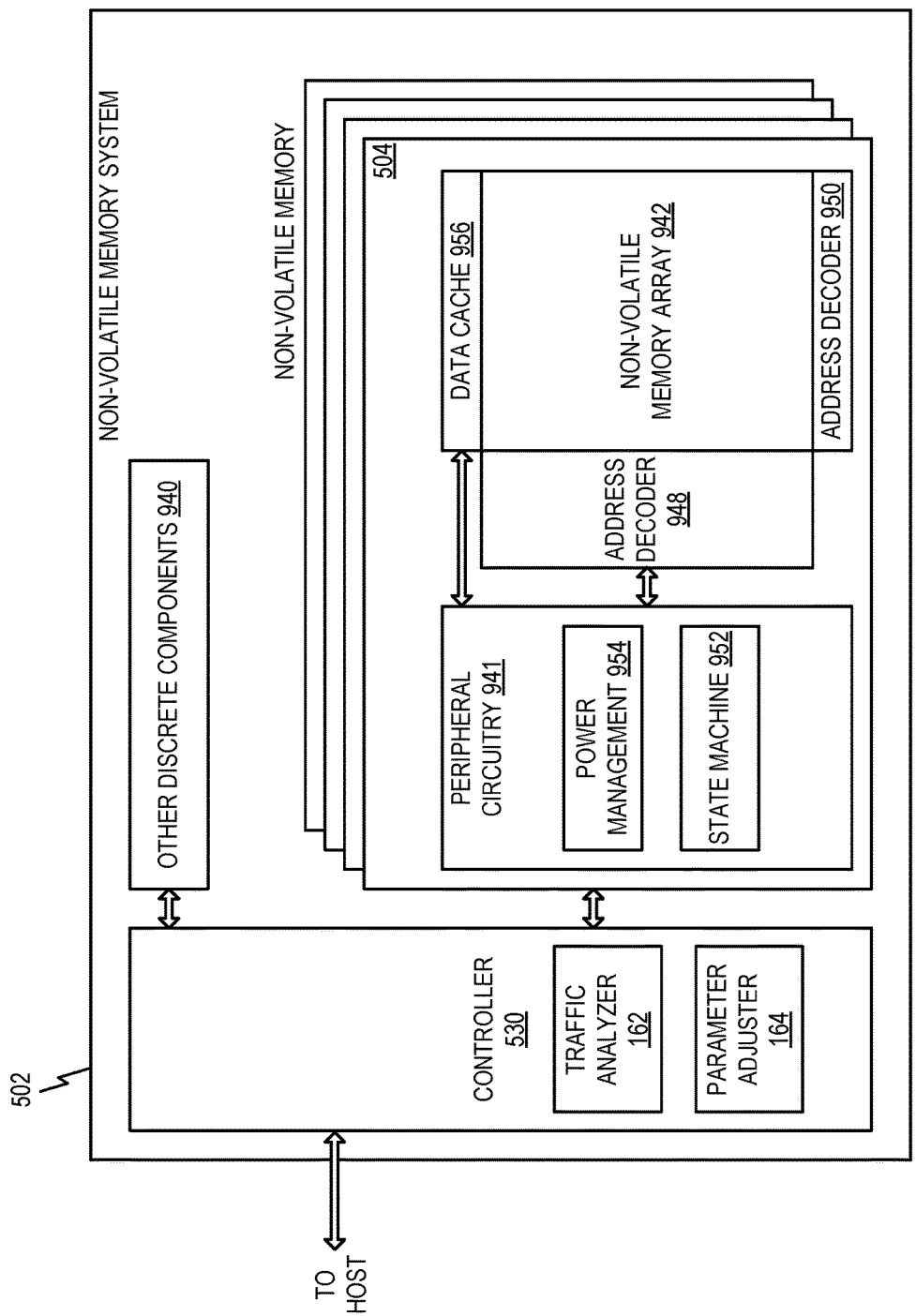
FIG. 9 is a block diagram of components of a particular illustrative implementation of a non-volatile memory die.

FIG. 9 is a block diagram illustrating exemplary components of the one or more non-volatile memory dies 504 of the non-volatile memory system 502 in more detail. The one or more non-volatile memory dies 504 include peripheral circuitry 941 and a non-volatile memory array 942. The non-volatile memory array 942 includes the non-volatile memory cells used to store data. The non-volatile memory cells may be any suitable non-volatile memory cells, including NAND flash memory cells and/or NOR flash memory cells in a two dimensional and/or three dimensional configuration. The peripheral circuitry 941 includes a state machine 952 that provides status information to the controller 530. The peripheral circuitry 941 may also include a power management or data latch control component 954. The one or more non-volatile memory dies 504 further include discrete components 940, an address decoder 948, an address decoder 950, and a data cache 956 that caches data. FIG. 9 also illustrates that the controller 530 may include the traffic analyzer 162 and the parameter adjuster 164.

Although various components of the data storage device 102 and/or the access device 150 of FIG. 1 are depicted herein as block components and described in general terms, such components may include one or more microprocessors, state machines, or other circuits configured to enable the various components to perform operations described herein. Components described herein may be operationally coupled to one another using one or more nodes, one or more buses (e.g., data buses and/or control buses), one or more other structures, or a combination thereof. One or more components described herein may include one or more physical components, such as hardware controllers, state machines, logic circuits, one or more other structures, or a combination thereof, to enable the data storage device 102 to perform one or more operations described herein. One or more aspects of the various components may be implemented using a microprocessor or microcontroller programmed to perform operations described herein, such as one or more operations of the method 300 of FIG. 3 or the method 400 of FIG. 4. In a particular implementation, each of the controller 120, the memory 104, and/or the access device 150 of FIG. 1 includes a processor executing instructions that are stored at a memory, such as a non-volatile memory of the data storage device 102 or the access device 150 of FIG. 1. Alternatively or additionally, executable instructions that are executed by the processor may be stored at a separate memory location that is not part of the non-volatile memory, such as at a read-only memory (ROM) of the data storage device 102 or the access device 150 of FIG. 1.

In conjunction with the described aspects, an apparatus includes means for storing data. For example, the means for storing may include the memory device 103 or the memory 104 of FIG. 1, the non-volatile memory dies 504 of FIGS. 5, 6, 8, and 9, one or more other devices, circuits, modules, or instructions to store data, or a combination thereof.

The apparatus further includes means for setting one or more decode parameter values to a first set of values based on a first traffic type and for setting the one or more decode parameter values to a second set of values based on a second traffic type, the first traffic type corresponding to a first set of read requests received from an access device according to a sequential access mode, the second traffic type corresponding to a second set of read requests received from the access device according to a random access mode. For example, the means for setting may include the traffic analyzer 162, the parameter adjuster 164, or the controller 120 of FIG. 1, the traffic analyzer 210, the parameter adjuster 220, or the controller 202 of FIG. 2, one or more other devices, circuits, modules, or instructions to set one or more decode parameter values to a first set of values based on a first traffic type and to set the one or more decode parameter values to a second set of values based on a second traffic type, or a combination thereof.

The apparatus may further include means for decoding a representation of data corresponding to the one or more read requests based on the one or more decode parameter values. For example, the means for decoding may include ECC decoder 166 or the controller 120 of FIG. 1, the ECC decoder 230 or the controller 202 of FIG. 2, one or more other devices, circuits, modules, or instructions to decode a representation of data corresponding to one or more read requests based on one or more decode parameter values, or a combination thereof. The one or more decode parameter values may include a decode mode parameter value, a timeout parameter value, LLR values, or a combination thereof.

With reference to FIG. 1, in some implementations, the data storage device 102 may be embedded within the access device 150, such as in accordance with a Joint Electron Devices Engineering Council (JEDEC) Solid State Technology Association Universal Flash Storage (UFS) configuration. Alternatively, the data storage device 102 may be removable from the access device 150 (i.e., "removably" coupled to the access device 150). As an example, the data storage device 102 may be removably coupled to the access device 150 in accordance with a removable universal serial bus (USB) configuration. In some implementations, the data storage device 102 may include or correspond to a solid state drive (SSD) which may be included in, or distinct from (and accessible to), the access device 150. For example, the data storage device 102 may include or correspond to an SSD, which may be used as an embedded storage drive (e.g., a mobile embedded storage drive), an enterprise storage drive (ESD), a client storage device, or a cloud storage drive, as illustrative, non-limiting examples. In some implementations, the data storage device 102 may be coupled to the access device 150 indirectly, e.g., via a network. For example, the network may include a data center storage system network, an enterprise storage system network, a storage area network, a cloud storage network, a local area network (LAN), a wide area network (WAN), the Internet, and/or another network. In some implementations, the data storage device 102 may be a network-attached storage (NAS) device or a component (e.g., a solid-state drive (SSD) device) of a data center storage system, an enterprise storage system, or a storage area network.

In some implementations, the data storage device 102 may be configured to be coupled to the access device 150 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). Alternatively, the data storage device 102 may be removable from the access device 150 (e.g., "removably" coupled to the access device 150). As an example, the data storage device 102 may be removably coupled to the access device 150 in accordance with a removable universal serial bus (USB) configuration.

The data storage device 102 may operate in compliance with an industry specification. For example, the data storage device 102 may include a SSD and may be configured to communicate with the access device 150 using a small computer system interface (SCSI)-type protocol, such as a serial attached SCSI (SAS) protocol. As other examples, the data storage device 102 may be configured to communicate with the access device 150 using a NVM Express (NVMe) protocol or a serial advanced technology attachment (SATA) protocol. In other examples, the data storage device 102 may operate in compliance with a JEDEC eMMC specification, a JEDEC universal flash storage (UFS) specification, one or more other specifications, or a combination thereof, and may be configured to communicate using one or more protocols, such as an eMMC protocol, a UFS protocol, a USB protocol, and/or another protocol, as non-limiting examples.

In some implementations, the data storage device 102 and the access device 150 may be configured to communicate using one or more protocols, such as a SAS protocol, a SATA protocol, an NVMe protocol, an eMMC protocol, a UFS protocol, a USB protocol, and/or another protocol, as illustrative, non-limiting examples. The one or more protocols may include a standardized protocol and/or a non-standardized protocol, such as a proprietary protocol. As other examples, the access device 150 may operate in compliance with a JEDEC industry specification, such as a UFS Access Controller Interface specification. In some implementations, the data storage device 102 and the access device 150 may be configured to communicate using dual channel communication (e.g., both devices may issue and receive commands from the other device).

Semiconductor memory devices include volatile memory devices, such as dynamic random access memory ("DRAM") or static random access memory ("SRAM") devices, non-volatile memory devices, such as magnetoresistive random access memory ("MRAM"), resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information.

Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where they direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of a non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor material such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically used for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional illustrative structures described but cover all relevant memory structures within the scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A device comprising:
   a non-volatile memory; and
   a controller, the controller connected to the non-volatile memory, the controller comprising an electronic processor that when executing instructions configures the controller to:
   generate a traffic type indicator based on one or more read requests from an access device to access data at the non-volatile memory, the traffic type indicator having a first value responsive to the one or more read requests corresponding to a first traffic type and having a second value responsive to the one or more read requests corresponding to a second traffic type; and
   designate one or more decode parameter values based on the traffic type indicator to improve performance of a decoding process of the controller.

2. The device of claim 1, wherein the controller is further configured to determine whether the one or more read requests correspond to the first traffic type or to the second traffic type at least partially based on addresses or command sizes associated with the one or more read requests.

3. The device of claim 1, wherein the first traffic type corresponds to read requests that include sequential logical block addresses, and wherein the second traffic type corresponds to read requests that include non-sequential logical block addresses.

4. The device of claim 1, wherein the first traffic type corresponds to read requests having first command sizes that are less than or equal to a threshold, and wherein the second traffic type corresponds to read requests having second command sizes that exceed the threshold.

5. The device of claim 1, further comprising an error correction code (ECC) decoder configured to decode a representation of the data from the non-volatile memory based on the one or more decode parameter values.

6. The device of claim 5, wherein the controller is further configured to send a parameter adjustment message to the ECC decoder.

7. The device of claim 6, wherein the parameter adjustment message includes the one or more decode parameter values.

8. The device of claim 6, wherein the parameter adjustment message indicates a location of the one or more decode parameter values.

9. The device of claim 1, wherein the one or more decode parameter values include timeout parameter values, log likelihood ratio (LLR) values, decode mode parameter values, or a combination thereof.

10. The device of claim 1, further comprising an interface configured to receive the one or more read requests from the access device.

11. A method comprising:
    at a device including a non-volatile memory coupled to a controller comprising an electronic processor:
    receiving, by the controller, a first plurality of read requests from an access device, the first plurality of read requests having a first pattern;
    setting, by the controller, one or more decode parameter values at an error correction code (ECC) decoder to a first set of values based on the first plurality of read requests having the first pattern;
    receiving, by the controller, a second plurality of read requests from the access device, the second plurality of read requests having a second pattern; and
    setting, by the controller, the one or more decode parameter values to a second set of values based on the second plurality of read requests having the second pattern to improve performance of a decoding process of the controller.

12. The method of claim 11, wherein the first pattern corresponds to a throughput-based decode scheme, and wherein the second pattern corresponds to a quality of service (QoS)-based decode scheme.

13. The method of claim 12, wherein the first pattern includes a pattern of sequential logical block addresses, and wherein the second pattern includes a pattern of non-sequential logical block addresses.

14. The method of claim 12, wherein the first set of values includes a first decode mode parameter value that enables data sharing between multiple decoding modes of the ECC decoder, and wherein the second set of values includes a second decode mode parameter value that disables data sharing between the multiple decoding modes.

15. The method of claim 12, wherein the first set of values includes a first timeout parameter value corresponding to a decoding mode of the ECC decoder, and wherein the second set of values includes a second timeout parameter value that corresponds to a shorter timeout duration than the first timeout parameter value.

16. The method of claim 12, wherein the first set of values includes a first set of log likelihood ratio (LLR) values, and wherein the second set of values includes a second set of LLR values that is different than the first set of LLR values.

17. The method of claim 11, further comprising:
    decoding a first representation of data corresponding to the first plurality of read requests based on the first set of values; and
    decoding a second representation of data corresponding to the second plurality of read requests based on the second set of values.

18. The method of claim 11, wherein the first pattern is identified based on the first plurality of read requests including one or more indicators having a first value, and wherein the second pattern is identified based on the second plurality of read requests including one or more indicators having a second value.

19. An apparatus comprising:
    a controller, the controller comprising an electronic processor that executes instructions causing the controller to:
    set one or more decode parameter values to a first set of values based on a first traffic type; and
    set the one or more decode parameter values to a second set of values based on a second traffic type, the first traffic type corresponding to a first set of read requests received from an access device according to a sequential access mode and the second traffic type corresponding to a second set of read requests received from the access device according to a random access mode, to improve performance of a decoding process of the controller.

20. The apparatus of claim 19, further comprising a decoder for decoding a representation of data corresponding to the one or more read requests based on the one or more decode parameter values.

* * * * *